United States Patent
Shin et al.

(10) Patent No.: US 7,800,458 B2
(45) Date of Patent: Sep. 21, 2010

(54) WIDE-BAND VOLTAGE CONTROLLED OSCILLATOR

(75) Inventors: Hyunchol Shin, Seoul (KR); Jongsik Kim, Gyunggi-do (KR); Yunseong Eo, Seoul (KR); Soowoong Lee, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 198 days.

(21) Appl. No.: 12/208,019

(22) Filed: Sep. 10, 2008

(65) Prior Publication Data

US 2009/0066431 A1 Mar. 12, 2009

(30) Foreign Application Priority Data

Sep. 11, 2007 (KR) .................. 10-2007-0092165

(51) Int. Cl.
H03B 1/00 (2006.01)
(52) U.S. Cl. ............................. 331/177 V; 331/117 R; 331/117 FE; 331/34; 331/16; 331/177 R
(58) Field of Classification Search ........... 331/177 FE, 331/117 R, 177 V, 34, 16, 177 R
See application file for complete search history.

(56) References Cited

U.S. PATENT DOCUMENTS

| 7,202,754 B2 | 4/2007 | Komurasaki et al. |
| 7,483,508 B2 * | 1/2009 | Staszewski et al. ......... 375/376 |

\* cited by examiner

*Primary Examiner*—Arnold Kinkead
(74) *Attorney, Agent, or Firm*—Lowe Hauptman Ham & Berner LLP

(57) ABSTRACT

A wide-band voltage controlled oscillator includes a cross-connected transistors for providing a stable oscillating signal, an inductor unit for providing an inductance for determining a resonance frequency, a varactor bank including a plurality of switchable variable-capacitance elements parallely connected to the inductor unit and having a varactor capacitance varying with the first switching signal and a tuning voltage, a subsection capacitor bank including a plurality of switchable capacitor elements parallely connected to the inductor unit and having predetermined capacitances for grouping frequency sections, and a binary-weighted capacitor bank including a plurality of binary-weighted capacitor arrays parallely connected to the inductor unit and a bank selector for selecting one of the binary-weighted capacitor arrays, wherein each binary-weighted capacitor arrays includes a plurality of parallely connected switchable capacitor elements selectively switched on by a third switching signal to determine a variable weighted capacitance of the tunable binary-weighted capacitor bank.

17 Claims, 11 Drawing Sheets

WIDE-BAND VOLTAGE CONTROLLED OSCILLATOR

CROSS-REFERENCE TO RELATED APPLICATIONS

This application claims the priority of Korean Patent Application No. 2007-92165 filed on Sep. 11, 2007 in the Korean Intellectual Property Office, the disclosure of which is incorporated herein by reference.

BACKGROUND OF THE INVENTION

1. Field of the Invention

The present invention relates to a wide-band voltage controlled oscillator for wide-band wireless communication, and more particularly, to a wide-band voltage controlled oscillator that can vary oscillation frequency linearly over a wide bandwidth while having wide-band frequency tuning characteristics, by allowing amount of frequency variation for all digital control bits as well as VCO gain ($K_{VCO}$) with respect to control voltage of the voltage controlled oscillator according to a control signal to be kept constant using a pseudo-exponentially weighted capacitor bank.

2. Description of the Related Art

Recently, a voltage controlled oscillator having wide-band characteristics is highly required for a radio frequency (RF) transceiver supporting multiband multimode wireless communication. A general RF voltage controlled oscillator utilizing a fixed LC tank has narrow bandwidth characteristics. In this case, wide bandwidth characteristics can be obtained by utilizing the capacitance variation characteristic of the varactor diode in the LC tank. However, it may lead to a practical problem because the oscillation frequency variation by utilizing only a single varactor diode may also increase the voltage controlled oscillator gain ($K_{VCO}$) too much, and as a result may deteriorate the phase noise characteristics of the voltage controlled oscillator.

Therefore, a method for varying capacitance of the capacitor bank constituting the LC tank in the voltage controlled oscillator to cover a desired bandwidth while maintaining the capacitance variation of the varactor diode low is generally used.

Here, the capacitor bank is composed of several unit capacitors that are designed to have binary-weighted values of capacitances.

When a digital code is input thereto, the capacitance is varied in a linear way with respect to the input digital code and thus the oscillation frequency is varied nonlinearily, particularly in an exponential way for the binary weigthed capacitor bank.

The capacitor bank having the configuration described above causes the amount of frequency variation per a digital code to change and the VCO gain ($K_{VCO}$) to vary much as the digital input code changes. When the type of VCO is used for a phase locked loop (PLL), it will eventually cause severe differences in loop characteristic of the PLL, and thus may degrade the performances of the PLL system.

In addition, it causes the amount of frequency variation against a digital input code to vary greatly as the oscillation frequency varies. Accordingly, while the oscillation frequency of the voltage controlled oscillator are changed through the digital input code, the number of tuning curves that produces the same frequency may vary, which leads to difficulty in the design of the PLL system.

FIG. 1 is a circuit diagram of a conventional voltage controlled oscillator.

Referring to FIG. 1, the typical wide-band voltage controlled oscillator, which is a wide-band voltage controlled oscillator fabricated in a CMOS process, includes a negative-transconductance generation unit 10, an inductor unit 20, a variable capacitor unit 30, and a capacitor bank 40. The negative-transconductance generation unit 10 provides gain for compensating loss caused by parasitic components in an LC tank. The inductor unit 20 includes an inductor LT for providing inductance for resonance. The variable capacitor unit 30 is composed of varactor diodes whose capacitance varies with a tuning voltage VT. The capacitor bank 40 includes a plurality of capacitors which are connected in parallel and selected by a control signal. The total capacitance of the variable capacitor unit 30 and the capacitor bank 40 and the total inductance of the inductor unit 20 determine the resonance frequency of the tank.

The negative-transconductance generation unit 10 includes cross-coupled PMOS transistor pair 11 and cross-coupled NMOS transistor pair 12 to provide sufficient gain for stable oscillation. The cross-coupled PMOS transistor pair 11 is connected to a power supply voltage VDD and the cross-coupled NMOS transistor pair 12 is connected to a ground.

For example, the cross-coupled PMOS transistor pair 11 includes PMOS transistors MP1 and MP2. The gate of the PMOS transistor MP1 is connected to the drain of the PMOS transistor MP2 and the gate of the PMOS transistor MP2 is connected to the drain of the PMOS transistor MP1, respectively.

Such a wide-band voltage controlled oscillator includes a method of tuning the capacitance in a preferred way for determining the resonance frequency so as to obtain a wide-band characteristic.

For example, the capacitor bank 40 may be configured such that the composing unit capacitors have binary weighted values ($2^nC$). This allows the total capacitance $C_{tot}$ of the capacitor bank 40 selected by a binary digital control signal to be varied linearly. In this case, the oscillation frequency of the output signal is determined by the following expression:

$$f_c = \frac{1}{2\pi\sqrt{LT \cdot C_{tot}}} \tag{1}$$

where LT is an inductance of the inductor unit 20, $C_{tot}$ is a total capacitance of the variable capacitor unit 30 and the capacitor bank 40.

In Equation 1, if the capacitance of the variable capacitor unit 30 is much smaller than the total capacitance, the oscillation frequency $f_c$ will vary according to the digital control signal. In this case, the relations between the oscillation frequency, the tuning voltage, and the digital control signal are as shown in FIG. 2A.

As shown in FIG. 2A, as the oscillation frequency increases, the VCO gain ($K_{VCO}$) increases significantly.

FIG. 2B is a graph illustrating the relation between the oscillation frequency and the digital control signal when the tuning voltage $V_{tune}$ is fixed at a certain value.

As shown in FIG. 2B, as the oscillation frequency increases, the variation of the frequency against the digital control signal increases dramatically.

The reason is as follows. When the capacitor bank 40 is set to have a maximum capacitance, the oscillation frequency of the output signal is equal to:

$$f_c = \frac{1}{2\pi\sqrt{LT \cdot (C_{var} + C_{max})}} \quad (2)$$

where $C_{var}$ is a capacitance of the variable capacitor unit 30, and $C_{max}$ is the maximum capacitance of the capacitor bank 40.

Meanwhile, when the capacitor bank 40 is set to have a minimum capacitance, the oscillation frequency is equal to:

$$f_c = \frac{1}{2\pi\sqrt{LT \cdot (C_{var} + C_{min})}} \quad (3)$$

At a lowest oscillation frequency with $C_{max}$, the variation of the capacitance $C_{var}$ of the variable capacitor unit 30 is relatively small compared to the maximum capacitance $C_{max}$ of the capacitor bank 40. However, as the oscillation frequency becomes high, the variation of the capacitance $C_{var}$ of the variable capacitor unit 30 become relatively large compared to the minimum capacitance $C_{min}$ of the capacitor bank 40. Consequently, there is a big change of the VCO gain ($K_{VCO}$) with respect to the digital control signal as the oscillation frequency changes, as shown in FIG. 2A.

If the VCO gain ($K_{VCO}$) with respect to control voltage and the amount of frequency variation with respect to digital control signal vary significantly over the operating frequency range, lock time and phase noise may be deteriorated over the operating frequency of a system (e.g., a phase locked loop (PLL) system) to which the voltage controlled oscillator is applied.

Such a variation in the $K_{VCO}$ can be improved by controlling the capacitance of the varactor diode in proportion to the variation of the capacitance of the capacitor bank. However, simple adjustment of only the capacitance of the varactor diode according to the operating frequency could fail to compensate for the amount of frequency variation with respect to the digital code.

Furthermore, in a high frequency range, the number of overlapped tuning curves that correspond to a same frequency is decreased. As a result, the locking process of PLL would become unreliable. Furthermore, it may also increase the possibility of causing errors in the PLL operation in automatically determining an optimum digital code when a target frequency is given.

SUMMARY OF THE INVENTION

An aspect of the present invention provides a wide-band voltage controlled oscillator that can vary oscillation frequency linearly over a wide bandwidth while having wide-band frequency tuning characteristics, by allowing the amount of frequency variation with respect to digital control bit and the VCO gain ($K_{VCO}$) with respect to control voltage of the voltage controlled oscillator to be kept constant using a pseudo-exponentially weighted capacitor bank.

According to an aspect of the present invention, there is a wide-band voltage controlled oscillator including a cross-coupled oscillator core configured to generate a negative transconductance and thereby provide an resonance signal; an inductor unit configured to provide an inductance for determining a resonance frequency of the resonance signal; a varactor bank including a plurality of switchable variable-capacitance circuits which are connected to the inductor unit in parallel and have predetermined varactor capacitances, wherein one of the plurality of switchable variable-capacitance circuits is selected by a first switching signal so that the varactor bank has a varactor capacitance varying with a tuning voltage; a subsection capacitor bank comprising a plurality of switchable subsection capacitor connected to the inductor unit in parallel, having predetermined subsection-capacitances, and selectively switched on by a second switching signal so that the subsection capacitor bank has a variable subsection-capacitance; and a variable binary-weighted cap bank including several a plurality of capacitor banks connected to the inductor unit in parallel and a bank selector configured to select one of the plurality of binary-weighted capacitor banks according to a bank selection signal, wherein each of the plurality of binary-weighted capacitor banks includes a plurality of switchable binary-weighted capacitors which are connected in parallel to one another and selectively switched on by a third switching signal so that the variable binary-weighted capacitor bank has a variable capacitance, wherein the capacitance ratio of the varactor capacitance of the varactor bank to the total capacitance of the subsection capacitor bank and the variable binary-weighted capacitor bank is kept constant for a plurality of predetermined frequency ranges including a first frequency range, a second frequency range, a third frequency range and a fourth frequency range.

A variation rate of the varactor capacitance may be set to be identical to a total variation rate of the subsection capacitance and the variable binary-weighted capacitance.

The negative-transconductance generation part includes a first oscillator including a pair of PMOS transistors connected to a power supply voltage, wherein a gate and a drain of one of the pair of PMOS transistors are connected to a drain and a gate of the other, respectively; and a second oscillator including a pair of NMOS transistors connected to a ground voltage, wherein a gate and a drain of one of the pair of NMOS transistors are connected to a drain and a gate of the other, respectively.

Each of the plurality of switchable variable-capacitance circuits may be selected by the first switching signal to provide a varactor capacitance varying with the tuning voltage.

Each of the plurality of switchable variable-capacitance circuits may include at least one varactor diode having capacitance varying with the tuning voltage; and a switch connected between the varactor diode and the tuning voltage to apply the tuning voltage to the varactor diode according to the first switching signal.

Each of the plurality of switchable subscetion capacitor may include at least one capacitor; and a switch serially connected to the capacitor and turned on by the second switching signal.

Each of the plurality of switchable binary-weighted capacitors may include at least one capacitor; and a switch serially connected to the capacitor and turned on by the third switching signal.

The wide-band voltage controlled oscillator may further include an encoder configured to generate the first switching signal, the second switching signal, the bank selection signal and the third switching signal using a digital control signal.

The encoder may divide the digital signal into an upper two bits and a lower four bits to generate the first switching signal, the second switching signal and the bank selection signal using the upper two bits, and generates the third switching signal using the lower four bits.

The encoder may include a first encoder configured to generate the first 3-bit switching signal using upper two bits of the digital control signal of 6 bits; a second encoder configured to generate the second 3-bit switching signal using the upper two bits; and a third encoder configured to generate the bank selection signal of 4 bits by using the upper two bits.

The varactor bank may include the first to the fourth switchable variable-capacitance elements selected by the first 3-bit switching signal.

The subsection capacitor bank may include the first to the third switchable subsection capacitors selected by the second 3-bit switching signal.

The variable (or tunable) binary-weighted capacitor bank may include the first to the fourth binary-weighted capacitor banks, and the bank selector may select one of the binary-weighted capacitor banks according to the 4-bit bank selection signal to provide lower four bits in the 6-bit digital control signal to the selected capacitor bank.

The first encoder may generate the first switching signal including a first signal, a second signal and a third signal by using the upper two bits.

The first encoder may include: an OR gate configured to perform logic-OR operation on the upper two bits to generate the first signal of the first switching signal; and an AND gate configured to perform logic-AND operation on the upper two bits to generate the third signal of the first switching signal, and the first encoder delivers an uppermost bit in the upper two bits as the second signal of the first switching signal.

The second encoder may generate the second switching signal including a first signal, a second signal and a third signal by using the upper two bits.

The second encoder may include an OR gate configured to perform logic-OR operation on the upper two bits to generate the first signal of the second switching signal; and an AND gate configured to perform logic-AND operation on the upper two bits to generate the third signal of the second switching signal, and the second encoder delivers an uppermost bit in the upper two bits as the second signal of the second switching signal.

The third encoder may include a first inverter configured to invert an uppermost bit in the 6-bit digital control signal; a second inverter configured to invert a second uppermost bit in the 6-bit digital control signal; a first AND gate configured to perform logic-AND operation on output signals of the first and second inverters to generate a first signal; a second AND gate configured to perform logic-AND operation on the output signal of the first inverter and the second uppermost bit to generate a second signal; a third AND gate configured to perform logic-AND operation on the uppermost bit and the output signal of the second inverter to generate a third signal; and a fourth AND gate configured to perform logic-AND operation on the uppermost bit and the second uppermost bit to generate a fourth signal.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
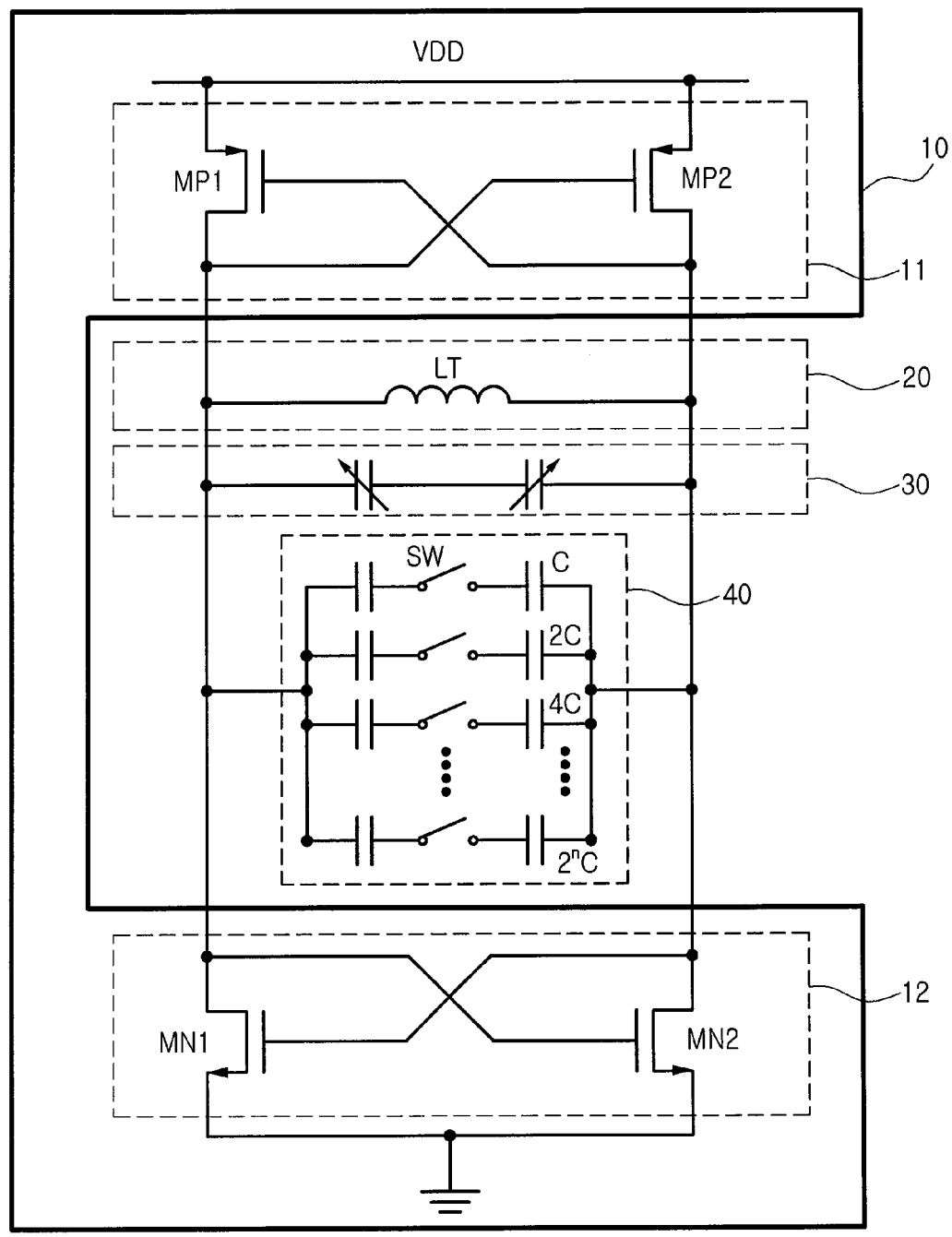
FIG. 1 is a circuit diagram of a typical voltage controlled oscillator.
Figure 2A:
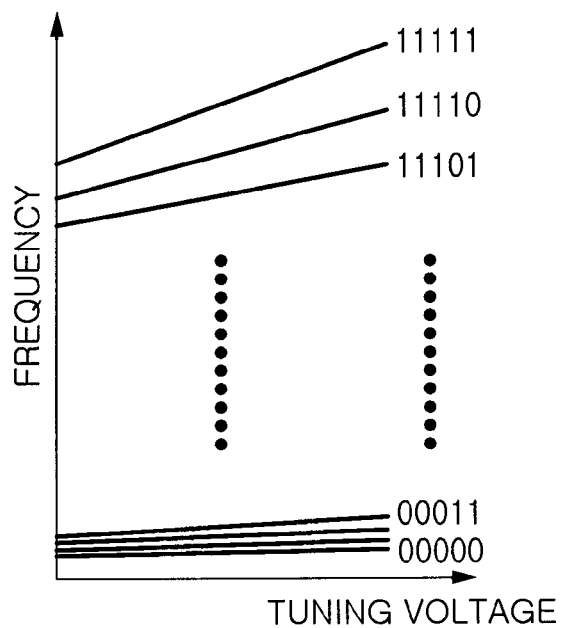
FIG. 2A is a graph illustrating frequency tuning characteristics with respect to a tuning voltage in the typical voltage controlled oscillator for all digital control bit.
Figure 2B:
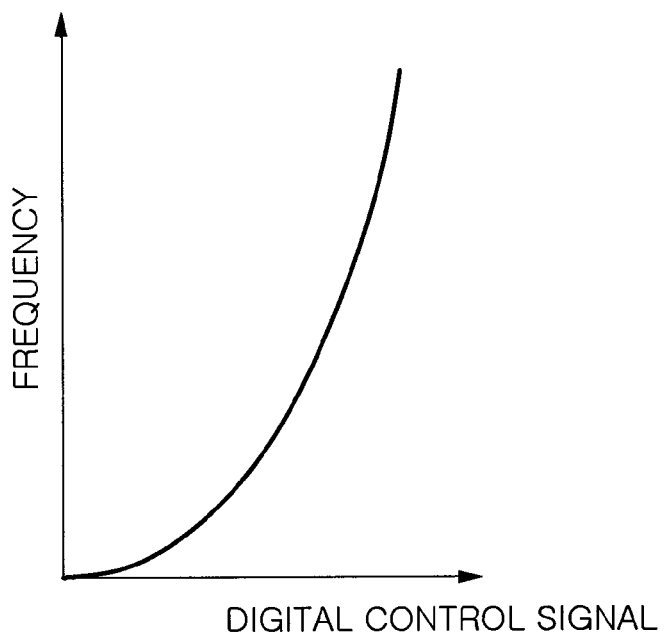
FIG. 2B is a graph illustrating frequency tuning characteristics with respect to digital control signal in the typical voltage controlled oscillator.

Exemplary embodiments of the present invention will now be described in detail with reference to the accompanying drawings.

Here, the present invention should not be construed as being limited to the embodiments set forth herein; rather, these embodiments are provided so that this disclosure will be thorough and complete, and will fully convey the concept of the invention to those skilled in the art. Like reference numerals in the drawings denote elements of substantially like configurations and functions.

Figure 3:
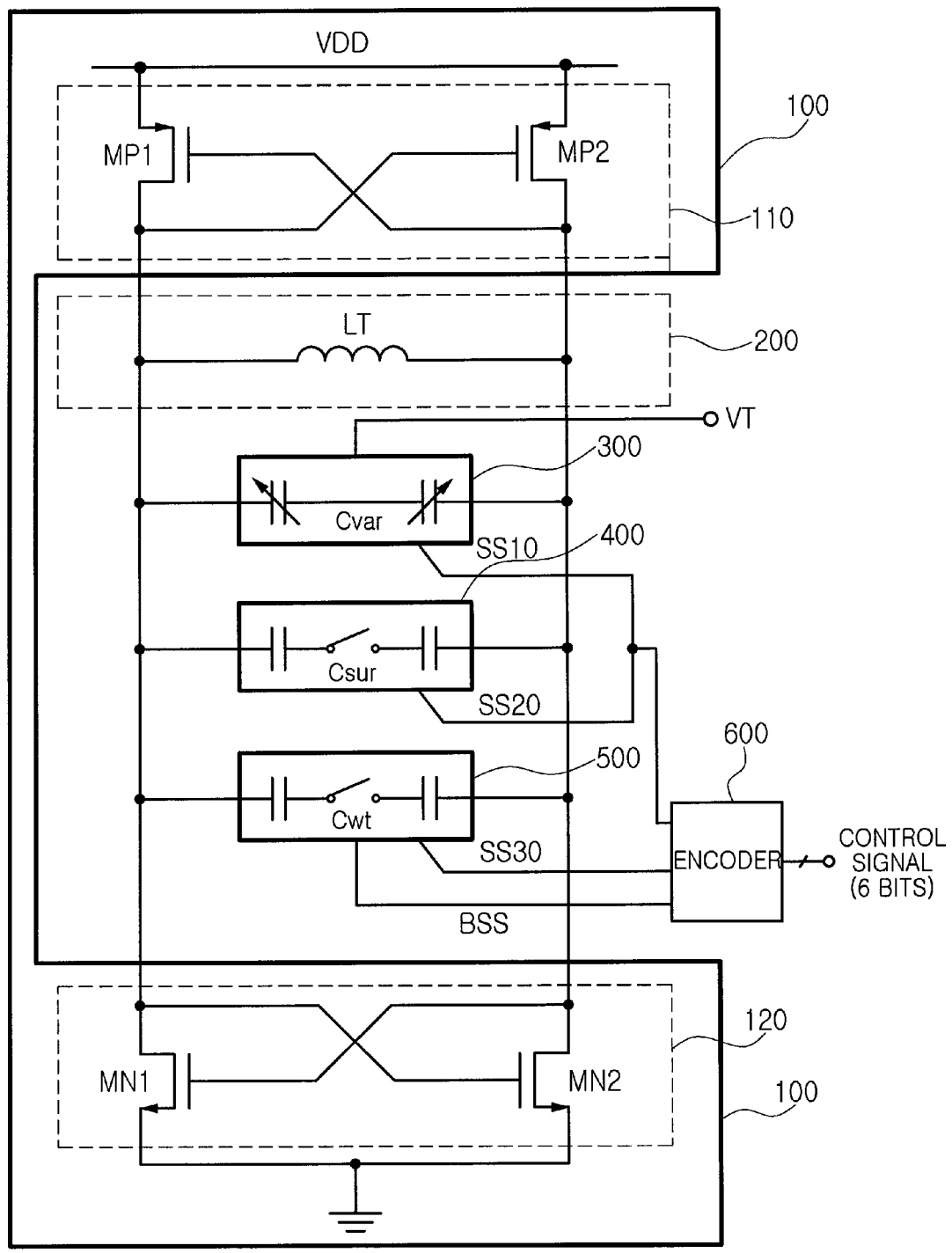
FIG. 3 is a circuit diagram of a voltage controlled oscillator according to an embodiment of the present invention.

FIG. 3 is a circuit diagram of a voltage controlled oscillator according to an embodiment of the present invention.

Referring to FIG. 3, the voltage controlled oscillator includes a negative-transconductance generation unit 100, an inductor unit 200, a varactor bank 300, a subsection capacitor bank 400, and a binary-weighted capacitor bank 500.

The negative-transconductance generation unit 100 provides oscillation gain for stable resonance. The negative-transconductance generation unit 100 includes a cross-coupled PMOS transistor pair 110 and a cross-coupled NMOS transistor pair 120. The cross-coupled PMOS transistor pair 110 includes PMOS transistors MP1 and MP2 connected to a power supply voltage VDD. The gate of the PMOS transistor MP1 is connected to the drain of the PMOS transistor MP2, and the drain of the PMOS transistor MP1 is connected to the gate of the PMOS transistor MP2. The cross-coupled NMOS transistor pair 120 includes a pair of NMOS transistors MN1 and MN2 connected to a ground. The gate of the NMOS transistor MN1 is connected to the drain of the NMOS transistor MN2, and the drain of the NMOS transistor MN1 is connected to the gate of the NMOS transistor MN2.

The inductor unit 200 includes an inductor such as a coil to provide a predetermined inductance for determining a resonance frequency.

Figure 4:
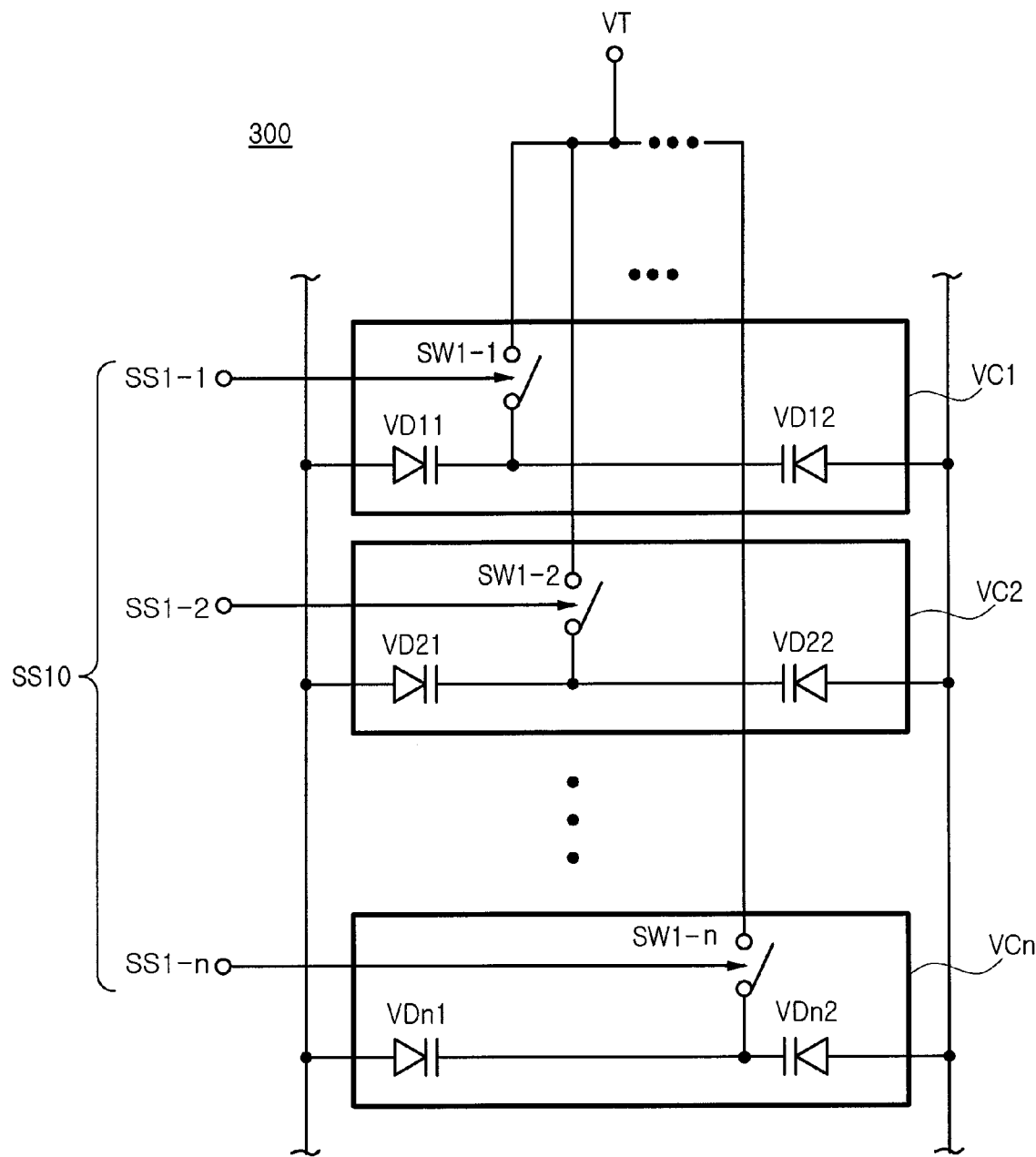
FIG. 4 is a circuit diagram of a varactor bank in the voltage controlled oscillator of FIG. 3.

FIG. 4 is a circuit diagram of a varactor bank in the voltage controlled oscillator of FIG. 3.

Referring to FIGS. 3 and 4, the varactor bank 300 includes a plurality of switchable variable-capacitance elements VC1 to VCn each having a predetermined varactor capacitance $C_{var}$. The switchable variable-capacitance elements VC1 to VCn are connected to the inductor unit 200 in parallel. At least one of the switchable variable-capacitance elements VC1 to VCn is selected by a first switching signal SS10 to provide a varactor capacitance $C_{var}$ varying with a tuning voltage.

Each of the switchable variable-capacitance elements VC1 to VCn includes one or more varactors (variable capacitor) and switches. The varactor has a capacitance varying with the tuning voltage. The switch is connected between the varactors and the tuning node VT to apply the tuning voltage to the varactors in response to a first switching signal SS10.

For example, as shown in FIG. 4, a first switchable variable-capacitance element VC1 among the plurality of the switchable variable-capacitance element VC1 to VCn includes two varactors VD11 and VD12 and a switch SW1-1. The varactors VD11 and VD12 are serially connected to each other and formed in common-node configuration, and have capacitance varying with respect to the tuning voltage. The switch SW1-1 is connected between a common-node of the varactors VD11 and VD12 and the tuning node VT to apply the tuning voltage to the common-node of the varactors VD11 and VD12 in response to the first switching signal SS10.

A second switchable variable-capacitance circuit VC2 among the plurality of the switchable variable-capacitance circuits VC1 to VCn includes two varactors VD21 and VD22 and a switch SW1-2. The varactors VD21 and VD22 are serially connected to each other in common-cathode configuration, and have capacitances varying with the tuning voltage VT. The switch SW1-2 is connected between a common node of the varactors VD21 and VD22 and the tuning voltage VT to apply the tuning voltage VT to the common node of the varactors VD21 and VD22 in response to the first switching signal SS10.

An n-th switchable variable-capacitance circuit VCn among the plurality of the switchable variable-capacitance circuits VC1 to VCn includes two varactors VDn1 and VDn2 and a switch SW1-n. The varactors VDn1 and VDn2 are serially connected to each other in common-cathode configuration, and have capacitances varying with the tuning voltage VT. The switch SW1-n is connected between a common node of the varactors VDn1 and VDn2 and the tuning voltage VT to apply the tuning voltage VT to the common node of the varactors VDn1 and VDn2 in response to the first switching signal SS10.

Figure 5:
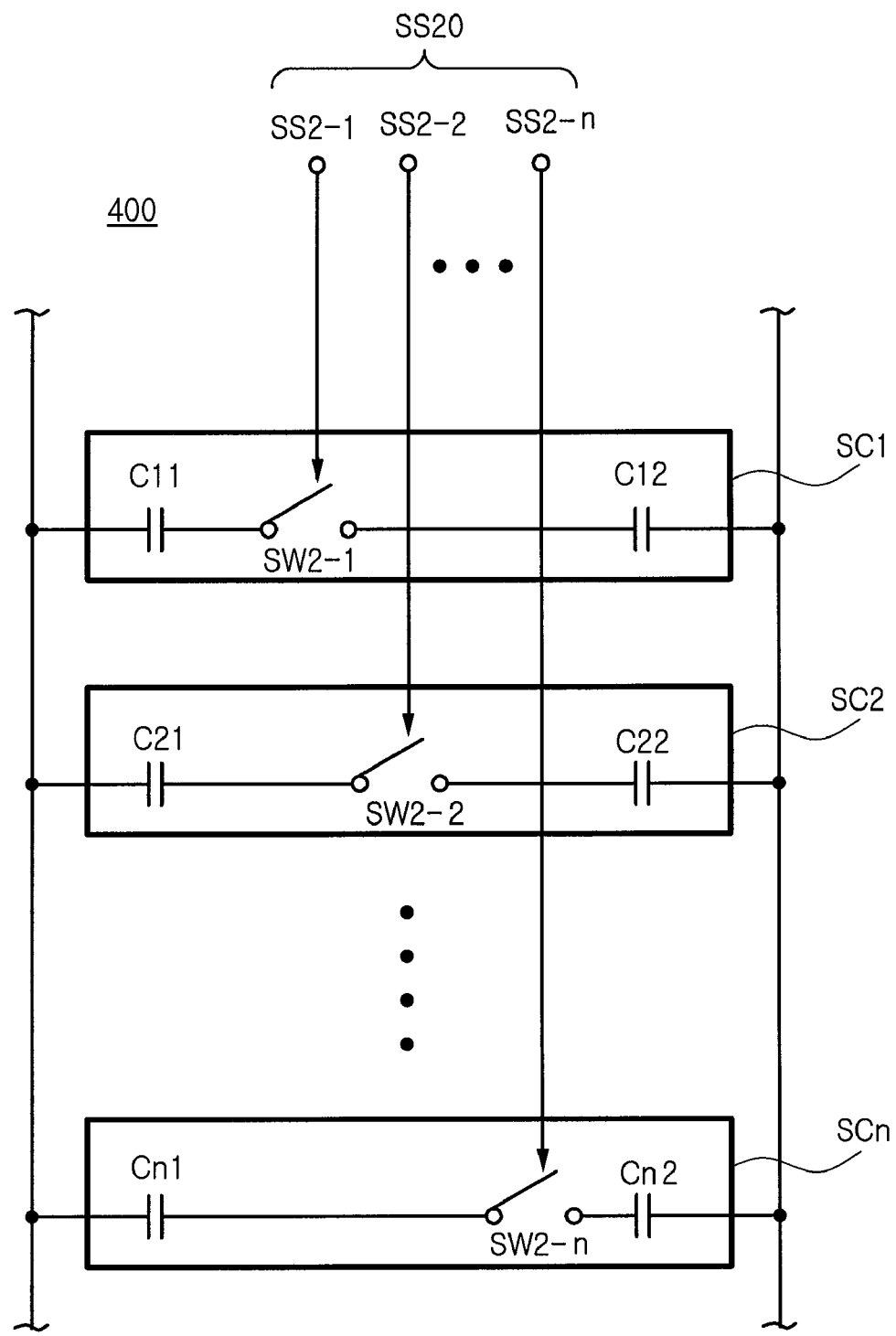
FIG. 5 is a circuit diagram of a subsection capacitor bank in the voltage controlled oscillator of FIG. 3.

FIG. 5 is a circuit diagram of a subsection capacitor bank in the voltage controlled oscillator of FIG. 3.

Referring to FIGS. 3 to 5, the subsection capacitor bank 400 includes a plurality of several switchable capacitor elements SC1 to SCn connected in parallel to the inductor unit 200. The switchable capacitor elements SC1 to SCn have respective predetermined subsection capacitance $C_{sub}$. The switchable capacitor elements SC1 to SCn are selectively switched on by a second switching signal SS20 to provide the variable subsection capacitance $C_{sub}$.

Each of the switchable capacitor elements SC1 to SCn may include at least one capacitor and a switch which is serially connected to the capacitor and turned on by the second switching signal SS20.

For example, as shown in FIG. 5, a first switchable capacitor element SC1 among the plurality of switchable capacitor elements SC1 to SCn may include two capacitors C11 and C12 and a switch SW2-1. The capacitors C11 and C12 are serially connected to each node of the switch SW2-1. The switch SW2-1 is serially connected between the capacitors C11 and C12 and turned on by the second switching signal SS20.

A second switchable capacitor element SC2 among the plurality of switchable capacitor elements SC1 to SCn may include two capacitors C21 and C22 and a switch SW2-2. The capacitors C21 and C22 are serially connected to each node of the switch SW2-2. The switch SW2-2 is serially connected between the capacitors C21 and C22 and turned on by the second switching signal SS20.

An n-th switchable capacitor element SCn among the plurality of switchable capacitor elements SC1 to SCn may include two capacitors Cn1 and Cn2 and a switch SW2-n. The capacitors Cn1 and Cn2 are serially connected to respective nodes of a switch SW2-n. The switch SW2-n is serially connected between the capacitors Cn1 and Cn2 and turned on by the second switching signal SS20.

Figure 6:
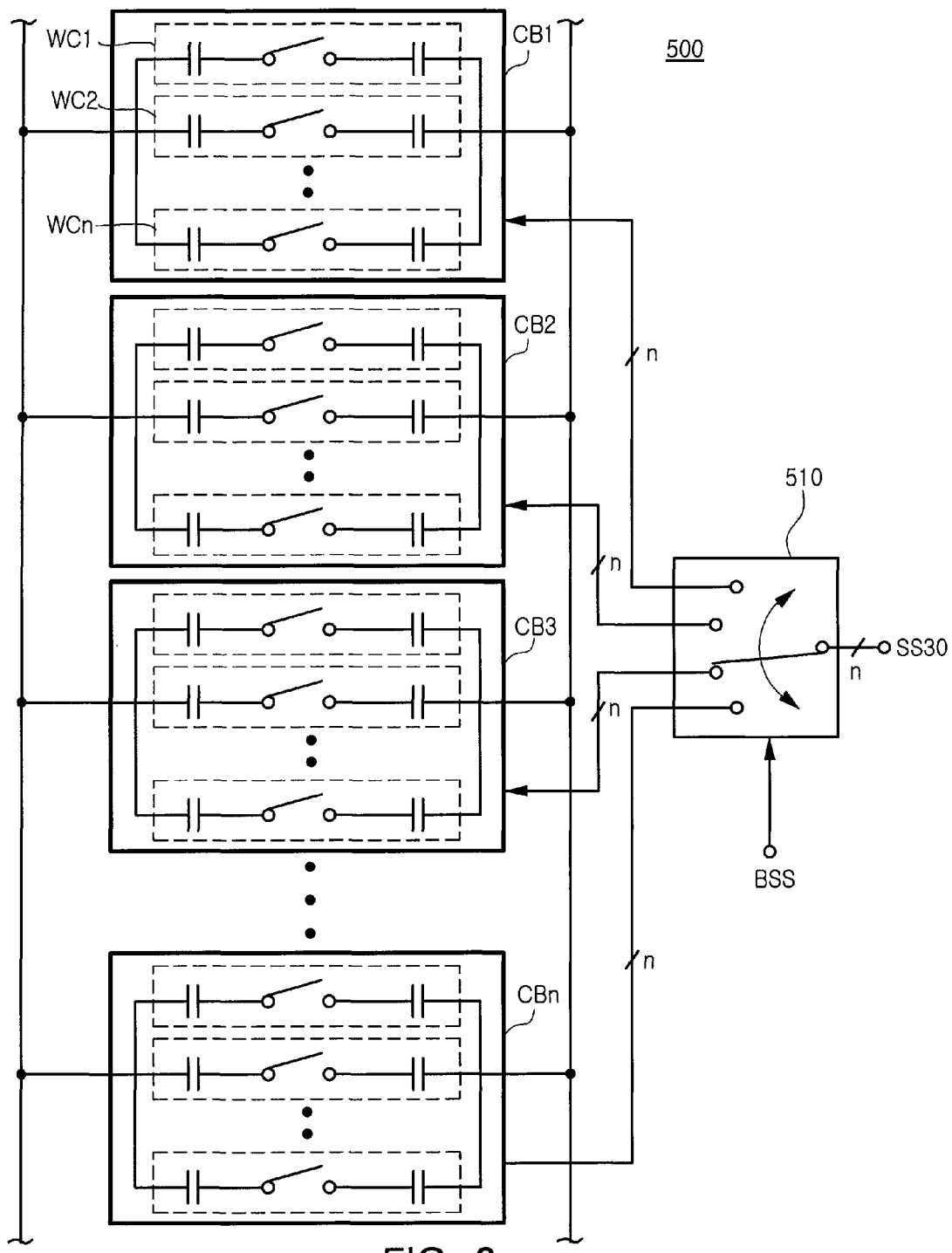
FIG. 6 is a circuit diagram of a binary-weighted capacitor bank in the voltage controlled oscillator of FIG. 3.

FIG. 6 is a circuit diagram of a binary-weighted capacitor bank in the voltage controlled oscillator of FIG. 3.

Referring to FIGS. 3 to 6, the tunable binary-weighted capacitor bank 500 includes a plurality of binary-weighted capacitor banks CB1 to CBn and a bank selector 510. The binary-weighted capacitor banks CB1 to CBn are connected to the inductor unit 200 in parallel. The bank selector 510 is configured in order to select a capacitor bank from the binary-weighted capacitor banks CB1 to CBn according to a bank selection signal BSS.

Each of the capacitor banks CB1 to CBn includes a plurality of switchable capacitors WC1 to WCn connected in parallel to one another. The switchable capacitors WC1 to WCn are selectively switched on by a third switching signal SS30. As such, a weighted capacitance $C_{wt}$ can be varied.

Each of the switchable capacitor elements WC1 to WCn may include at least one capacitor and a switch. The switch is serially connected to the capacitor and turned on by the third switching signal.

For example, as shown in FIG. 6, each of the switchable capacitor elements WC1 to WCn may include two capacitors and a switch, like the first switchable capacitor element SC1 shown in FIG. 5. The capacitors are serially connected to respective nodes of a switch. The switch is serially connected between the capacitors and turned on by a third switching signal SS30.

In the wide-band voltage controlled oscillator described above, a variation ratio of the variable capacitance $C_{var}$ in the varactor bank 300 may be set to be identical to a total variation rate of the capacitance $C_{sub}$ by the subsection capacitor bank 400 and the capacitance $C_{wt}$ by the binary-weighted capacitor bank 500.

That is, the ratio of the varactor capacitance by the varactor bank 300 to the total capacitance which is obtained by the subsection capacitor bank 400 and the binary-weighted cap bank 500 is kept constant over the predetermined frequency ranges.

Accordingly, by employing the capacitor banks 300, 400, and 500, the wide-band voltage controlled oscillator has a constant amount of frequency variation against digital control signal and thus maintain a linear slope in frequency increment with respect to digital control signal when the varactor tuning voltage is fixed at an arbitrary value.

In addition, the wide-band voltage controlled oscillator may include an encoder 600 for generating the first switching signal SS10, the second switching signal SS20, the third switching signal SS30, and the bank selection signal BSS from a digital control signal, as shown in FIG. 3.

Figure 7:
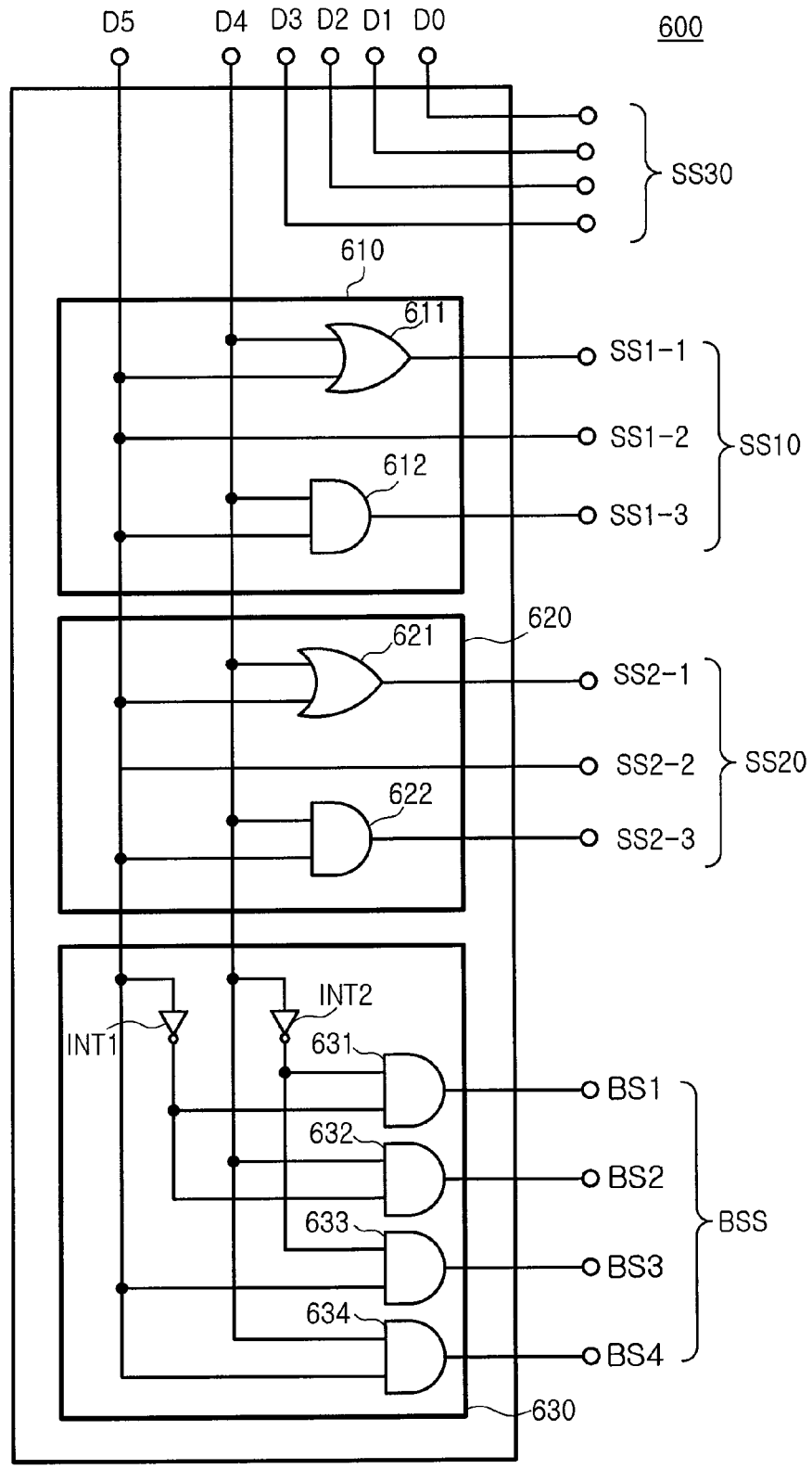
FIG. 7 is a circuit diagram of an encoder in the voltage controlled oscillator of FIG. 3.

FIG. 7 is a circuit diagram of the encoder in the voltage controlled oscillator as shown in FIG. 3.

Referring to FIGS. 3 to 7, the encoder 600 divides a digital control signal into upper bits and lower bits. And then, the encoder generates the first switching signal SS10, the second switching signal SS20 and the bank selection signal BSS by using the upper bits and generates the third switching signal SS30 by using the lower bits.

Referring to FIG. 7, the encoder 600 may include a first encoder 610, a second encoder 620, and a third encoder 630. The first encoder 610 generates a first 3-bit switching signal SS10 by using upper two bits from the 6-bit digital control signal (D0-D5). The second encoder 620 generates the second 3-bit switching signal SS20 by using the upper two bits from the 6-bit digital control signal (D0-D5). The third encoder 630 generates the 4-bit bank selection signal BSS by using the upper two bits from the 6-bit digital control signal (D0-D5).

Specifically, the first encoder 610 generates the first switching signal SS10 including a first signal SS1-1, a second signal SS1-2 and a third signal SS1-3 by using upper two bits of D5 and D4. Here, the first encoder 610 includes an OR gate 611 and an AND gate 612. The OR gate 611 performs logic-OR operation on the upper two bits of D5 and D4 to generate the first signal SS1-1 of the first switching signal SS10. The AND gate 612 performs logic-AND operation on the upper two bits of D5 and D4 to generate the third signal SS1-3 of the first switching signal SS10. The first encoder 610 also delivers the uppermost bit D5 as the second signal SS1-2 of the first switching signal SS10.

The second encoder 620 generates the second switching signal SS20 including a first signal SS2-1, a second signal SS2-2 and a third signal SS2-3 by using the upper two bits of D5 and D4. Here, the second encoder 620 may includes an OR gate 621 and an AND gate 622. The OR gate 621 performs logic-OR operation on the upper two bits of D5 and D4 to generate the first signal SS2-1 of the second switching signal SS20. The AND gate 622 performs logic-AND operation on the upper two bits of D5 and D4 to generate the third signal SS2-3 of the second switching signal SS20. The second encoder 620 also delivers the uppermost bit D5 as the second signal SS2-2 of the second switching signal SS20.

The third encoder 630 includes a first inverter INT1, a second inverter INT2, a first AND gate 631, a second AND gate 632, a third AND gate 633, and a fourth AND gate 634. The first inverter INT1 inverts the uppermost D5-bit. The second inverter INT2 inverts the D4-bit. The first AND gate 631 performs logic-AND operation on the output signals of the first and second inverters INT1 and INT2 to generate a first signal BS1. The second AND gate 632 performs logic-AND operation on the output signal of the first inverter INT1 and the D4-bit to generate a second signal BS2. The third AND gate 633 performs logic-AND operation on the uppermost D5-bit and the output signal of the second inverter INT2 to generate a third signal BS3. The fourth AND gate 634 performs logic-AND operation on the uppermost D5-bit and the D4-bit to generate a fourth signal BS4.

Figure 8:
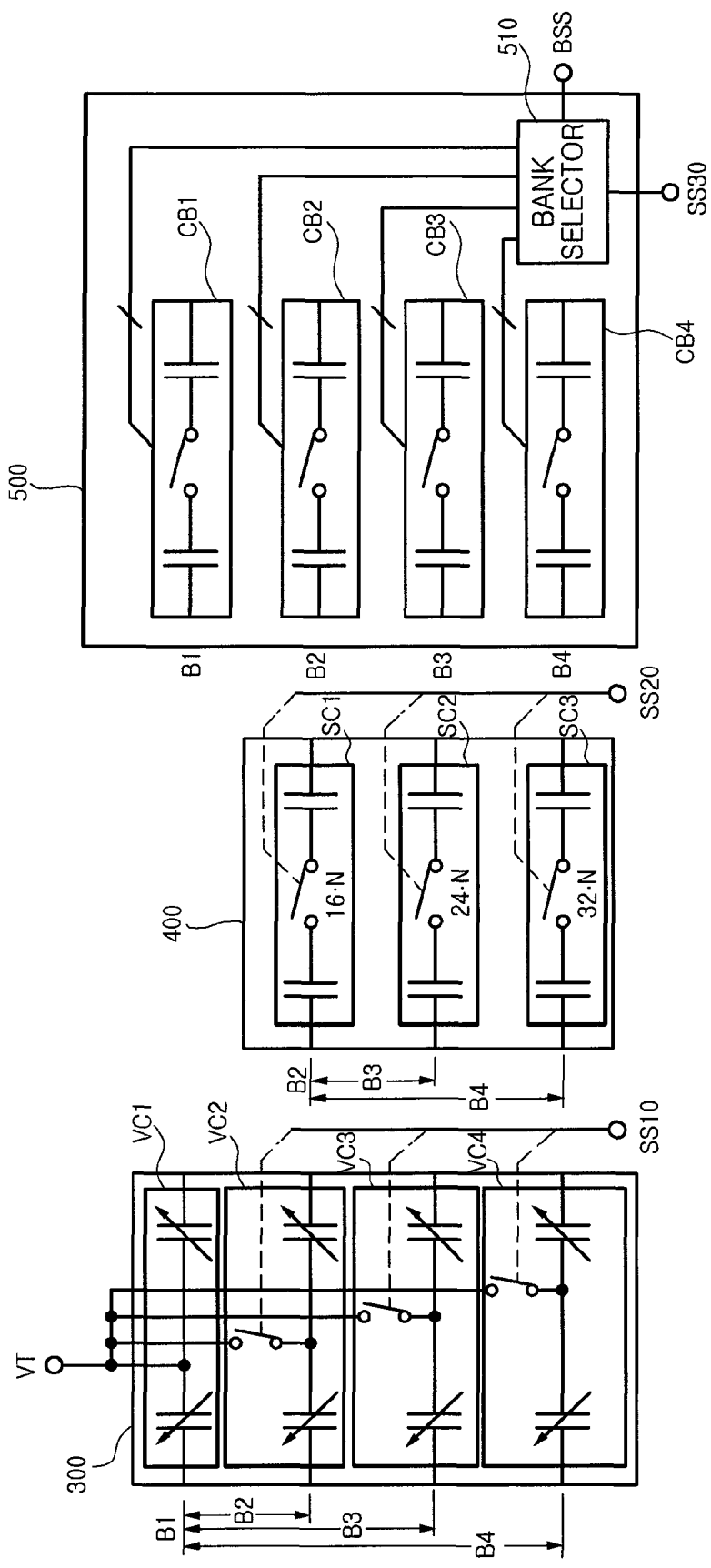
FIG. 8 is a circuit diagram of a total capacitor bank including a varactor bank, a subsection capacitor bank, and a binary-weighted capacitor bank according to an embodiment of the present invention.

FIG. 8 is a circuit diagram of a whole capacitor bank including a varactor bank, a subsection capacitor bank, and a binary-weighted capacitor bank of a voltage controlled oscillator according to an embodiment of the present invention.

Referring to FIG. 8, a varactor bank 300 may include first to fourth switchable variable-capacitance elements VC1 to VC4, and they are selected by a first 3-bit switching signal SS10.

The subsection capacitor bank 400 may consist of three switchable capacitor elements SC1, SC2 and SC3. and they are selected by a 3-bit second switching signal SS20.

The binary-weighted capacitor bank 500 may consist of four binary-weighted capacitor array CB1, CB2, CB3 and CB4 and a bank selector 510. Here, each of the binary-weighted capacitor array CB1, CB2, CB3 and CB4 is set to have different unit capacitance and be controlled by 4-bit digital signal from the bank selector 510 in 16-steps. The bank selector 510 selects one of four binary-weighted capacitor array CB1, CB2, CB3 and CB4 according to a 4-bit bank selection signal BBS. The 4-bits digital control signal SS30 is delivered to one of four binary-weighted capacitor array CB1, CB2, CB3 and CB4 selected by the bank selection signal BBS.

Figure 9A:
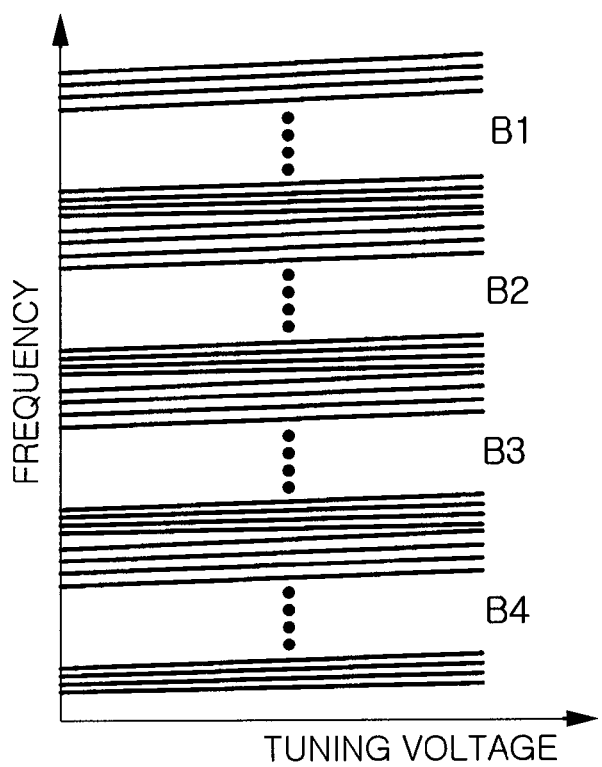
FIG. 9A is a graph illustrating frequency tuning characteristics with respect to tuning voltage for all digital control bits in a voltage controlled oscillator according to an embodiment of the present invention.

FIG. 9A is a graph illustrating frequency tuning curves of a voltage controlled oscillator according to an embodiment of the present invention against tuning voltage for all digital control signal. In FIG. 9A, the first to fourth frequency ranges denoted as B1 to B4 are frequency groups selected by the subsection capacitor bank 400. Within the whole frequency range associated with four frequency ranges B1, B2, B3 and B4, the frequency increment of two neighboring frequency tuning curves shows that the amount of frequency variation is almost kept constant with respect to the digital control signal.

Figure 9B:
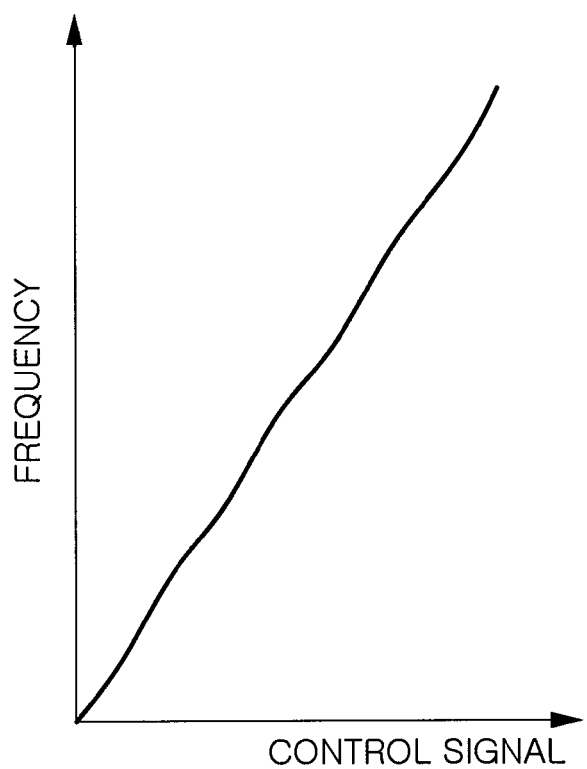
FIG. 9B is a graph illustrating conceptual frequency tuning characteristics with respect to digital control signal in a voltage controlled oscillator when the varactor tuning voltage is fixed at an arbitrary value according to an embodiment of the present invention.

FIG. 9B is a graph illustrating output frequency characteristic of a voltage controlled oscillator according to an embodiment of the present invention against the digital control signal when the varactor tuning voltage is fixed at an arbitrary value. FIG. 9B shows that the output frequency can be varied linearly across the whole tuning range.

Figure 10:
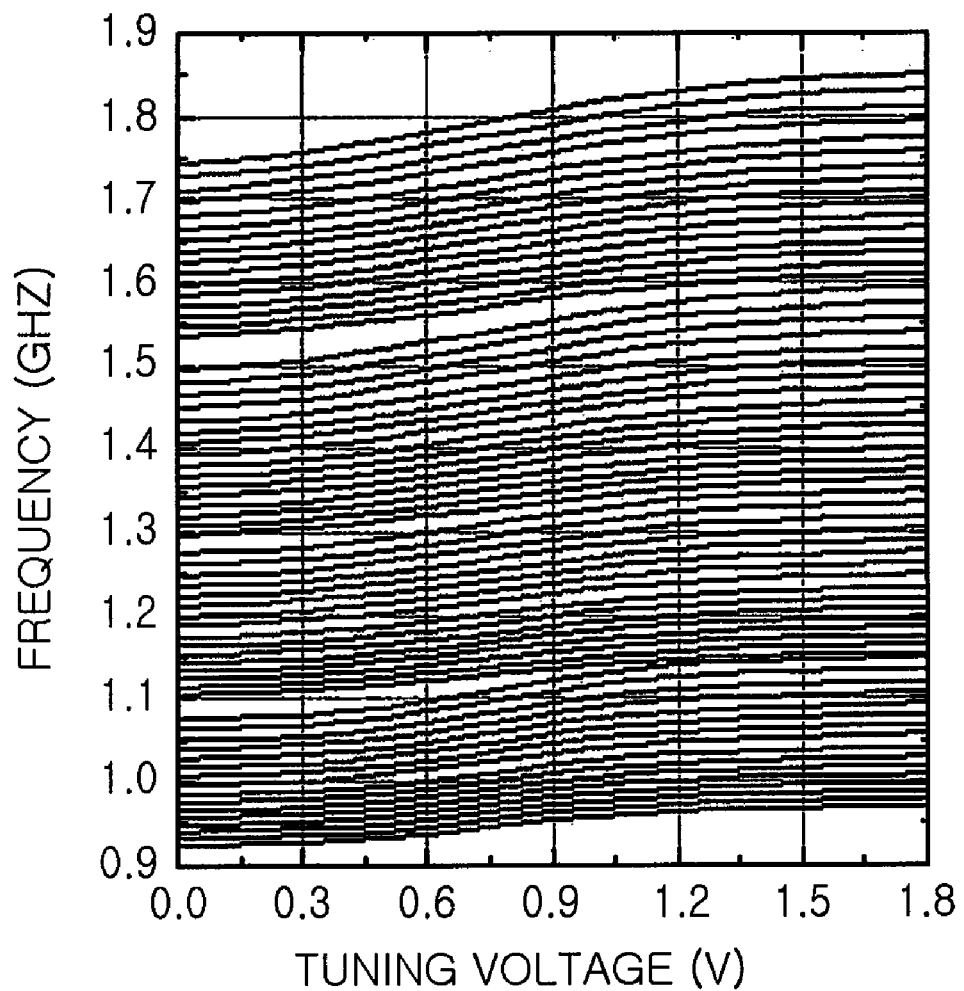
FIG. 10 is a graph illustrating actual frequency tuning characteristics with respect to tuning voltage of a voltage controlled oscillator for all digital control bits according to an embodiment of the present invention.
Figure 11:
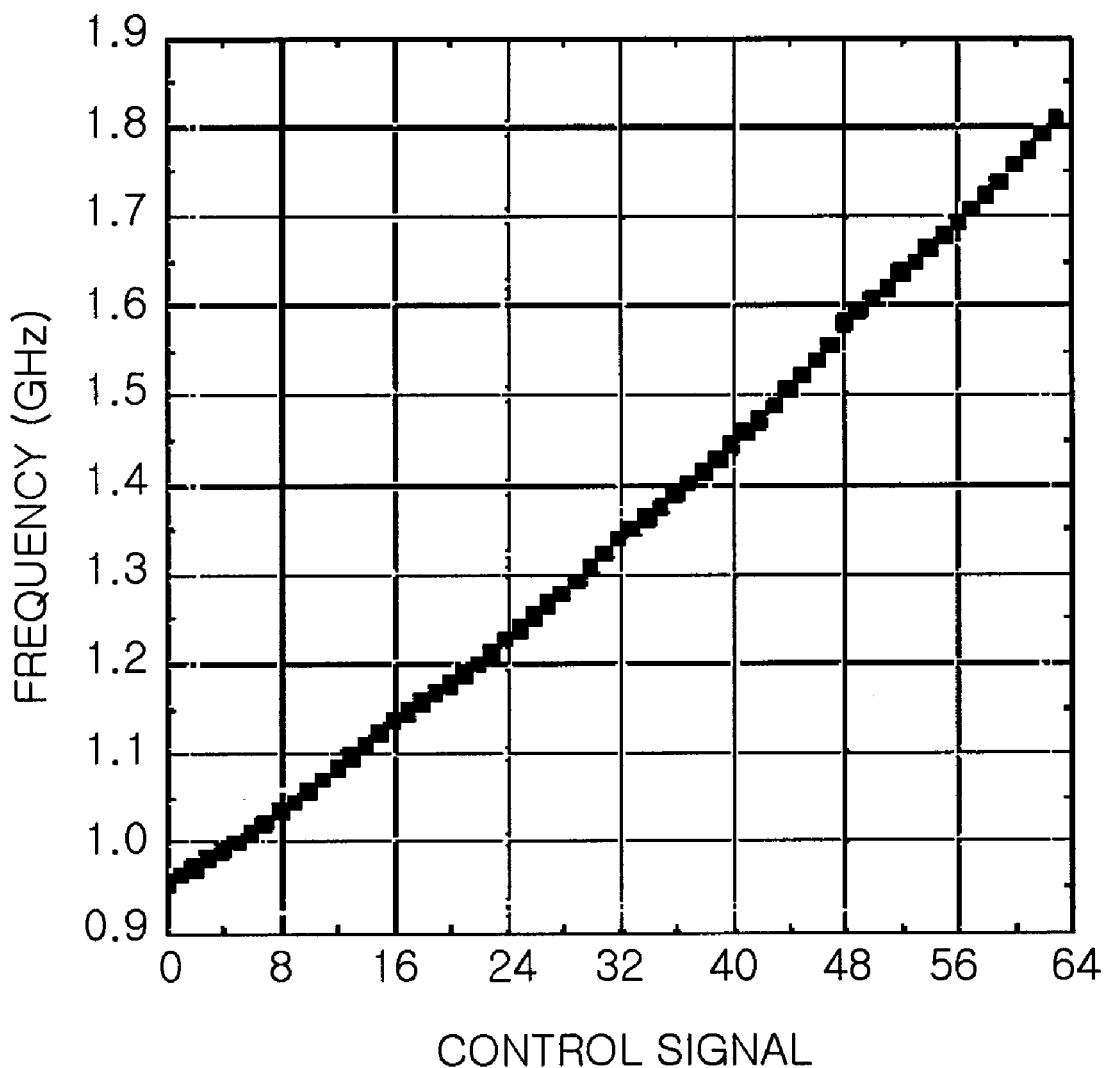
FIG. 11 is a graph illustrating actual frequency tuning characteristics with respect to digital control bits of a voltage controlled oscillator when the varactor tuning voltage is fixed at an arbitrary value according to an embodiment of the present invention.

FIG. 10 is a graph illustrating actual frequency tuning curves of a voltage controlled oscillator according to an embodiment of the present invention against tuning voltage for all digital control signals. FIG. 11 is a graph illustrating an actual output frequency characteristic of a voltage controlled oscillator according to an embodiment of the present invention against the digital control signal when the varactor tuning voltage is fixed at 0.9V.

From the experimental results shown in FIGS. 10 and 11, it is obvious that the amount of frequency variation with respect to digital control bit as well as the VCO gain ($K_{VCO}$) with respect to varactor tuning voltage can be maintained nearly constant when a voltage controlled oscillator employs the pseudo-exponential weighted capacitor bank of the present invention.

Hereinafter, the operations and effects of the voltage controlled oscillator will be described on the basis of accompanying drawings.

Referring to FIG. 3, the voltage controlled oscillator includes the negative transconductance generation unit 100, the inductor unit 200, the varactor bank 300, the subsection capacitor bank 400 and the tunable binary-weighted capacitor bank 500, and the encoder 600.

Herebelow, the overall operations of the voltage controlled oscillator will be described. The resonance frequency is determined by the inductance of the inductor unit 200 and the total capacitance of the varactor bank 300, the subsection capacitor bank 400, and the tunable binary-weighted capacitor bank 500. The oscillation condition is achieved by the sufficient loop gain of the negative transconductance generation unit 100 to stabilize the oscillation signal.

Here, the total capacitance obtained by the varactor bank 300, the subsection capacitor bank 400, and the binary-weighted capacitor bank 500 is determined by the control signals SS10, SS20, SS30 and the bank selection signal BSS which are generated by the encoder 600.

The negative transconductance generation unit 100 provides sufficient gain to compensate the energy loss due to parasitic resistance in the LC tank and thus maintains stable oscillation output signal. The negative transconductance generation unit 100 may consist of two cross-coupled transistor pair 110 and 120. The source nodes of the cross-coupled PMOS transistor pair 110 is connected to the supply voltage and the source nodes of the cross-coupled NMOS transistor pair 120 connected to the ground.

Here, the cross-coupled PMOS transistor pair 110 may include a pair of PMOS transistors MP1 and MP2 whose gates are cross-connected to the other drain nodes. That is, the gate and the drain of the PMOS transistor MP1 are connected to the drain and the gate of the PMOS transistor MP2. The cross-coupled NMOS transistor pair 120 includes a pair of NMOS transistors MN1 and MN2 whose gates are cross-connected to the other drain nodes. That is, the gate and the drain of the NMOS transistor MN1 are connected to the drain and the gate of the NMOS transistor MN2.

The oscillation occurs when the inductance of the inductor unit 200 and the total capacitance of the varactor bank 300, the subsection capacitor bank 400, and the binary-weighted capacitor bank 500 resonate together as well as the loop gain is sufficient to maintain the stable oscillation. Here, the output signal at a particular resonance frequency can vary as the total capacitance changes.

Referring to FIGS. 3 and 4, the varactor bank 300 includes a plurality of switchable variable-capacitance elements VC1 to VCn. The switchable variable-capacitance elements VC1 to VCn are connected to the inductor unit 200 in parallel and have predetermined varactor capacitances $C_{var}$. At least one switchable variable-capacitance element from the plurality of switchable variable-capacitance elements VC1 to VCn in the varactor bank 300 shown in FIG. 3 is selected by the first switching signal SS10 from the plurality of switchable variable-capacitance elements VC1 to VCn to provide the varactor capacitance $C_{var}$ which is varied by the tuning voltage.

At least one of the switchable variable-capacitance elements VC1 to VCn is selected by the first selection signal SS10. The varactor capacitance $C_{var}$ of the selected switchable variable-capacitance element is varied with the tuning voltage.

In FIG. 4, each of the switchable variable-capacitance elements VC1 to VCn may include two varactors and a switch. The varactors are serially connected together and thus form a common-node configuration to provide variable capacitance with respect to the tuning voltage. The switch SW1-1 is connected at the common node of the two varactors to apply the tuning voltage to the varactors in response to the first switching signal SS10.

In this case, the first switching signal SS10 makes the tuning voltage to be applied to at least one of the switchable variable-capacitance elements VC1 through VCn. The varactors of each switchable variable-capacitance element of which each common node is connected to the tuning node VT provide the variable capacitance $C_{var}$ as the tuning voltage changes.

Referring to FIGS. 3 and 5, the plurality of switchable capacitor elements SC1 to SCn in the subsection capacitor bank 400 are selectively switched on by the second switching signal SS20, and thereby provide the subsection capacitance $C_{sub}$ by activated switchable capacitor element.

Referring to FIG. 5, each of the switchable capacitor elements SC1 to SCn may include two capacitors serially connected to respective nodes of the switches SW2-1 to SW2-n, and a switch which is serially connected between the two capacitors and turned on by the second switching signal SS20.

Here, the switchable capacitor elements SC1 to SCn are selectively switched on by the second switching signal SS20, so that the sub-capacitance $C_{sub}$ is determined by the switched-on switchable capacitor element.

Referring to FIGS. 3 to 6, the bank selector 510 in the tunable binary-weighted capacitor bank 500 selects one of the binary-weighted capacitor banks CB1 to CBn according to the bank selection signal BSS. The selected binary-weighted capacitor bank includes a plurality of switchable capacitor elements WC1 to WCn.

Here, each of the switchable capacitor elements WC1 to WCn includes two capacitors serially connected to respective nodes of the switch, and a switch which is serially connected between the two capacitors and turned on by the third switching signal SS30.

Therefore, because the switch in each of the switchable capacitor elements WC1 to WCn is turned on by the third switching signal SS30, the switchable capacitor element including the turned-on switch provides the capacitance $C_{wt}$ determined by the capacitors therein.

In the wide-band voltage controlled oscillator described above, the variation rate of the varactor capacitance $C_{var}$ of the varactor bank 300 may be controlled to be identical to the total capacitance variation rate of the capacitance $C_{sub}$ of the subsection capacitor bank 400 and the capacitance $C_{wt}$ of the tunable binary-weighted capacitor bank 500.

Therefore, the wide-band voltage controlled oscillator can keep a constant frequency variation slope over a wide bandwidth corresponding to the frequency range of approximately 800 MHz to approximately 2.0 GHz.

Meanwhile, the encoder 600 of the wide-band voltage controlled oscillator generates the first selection signal SS10, the second selection signal SS20, the third selection signal SS30 and the bank selection signal BSS by using the digital control signal.

To this end, as shown in FIGS. 3 and 7, the encoder 600 may divide the digital control signal into upper bits and lower bits to generate the first switching signal SS10, the second switching signal SS20 and the bank selection signal BSS using the upper bits and generate the third switching signal SS30 using the lower bits.

Specifically, referring to FIG. 7, the encoder 600 may include the first encoder 610, the second encoder 620 and the third encoder 630. When the digital control signal is a 6-bit signal, the first encoder 610 may generate the first switching signal SS10 by using upper two bits among the six-bit the digital control signal. Also, the second encoder 620 may generate the second switching signal SS20 by using the upper two bits, and the third encoder 630 may generate the bank selection signal BSS by using the upper two bits.

As such, the first encoder 610, the second encoder 620 and the third encoder 630 can be realized as shown in FIG. 7.

For example, referring to FIGS. 7 and 8, when the digital control signal is a 6-bit signal including the bits of D5, D4, D3, D2, D1 and D0, the first encoder 610 generates the first signal SS10 with three bits of SS1-1, SS1-2 and SS1-3 by using the upper two bits of D5 and D4 of the digital control signal.

Also, the second encoder 620 provides the second switching signal SS20 with three bits of SS2-1, SS2-2 and SS2-3 by using the upper two bits of D5 and D4 of the digital control signal.

Further, the third encoder 630 provides the bank selection signal BSS with four bits of BS1, BS2, BS3 and BS4 by using the upper two bits of D5 and D4 of the digital control signal.

Referring to FIG. 8, at least one switchable variable-capacitance element is selected from the first to fourth switchable variable-capacitance elements VC1 to VC4 in the varactor bank 300 according to the first switching signal SS10 with the three bits of SS1-1, SS1-2 and SS1-3. The varactors in the selected switchable variable-capacitance element provide the variable capacitance $C_{var}$ varying with the tuning voltage.

Also, the first to third switchable capacitor elements SC1 to SC3 in the subsection capacitor bank 400 are selectively switched on by the second switching signal SS20 with the three bits of SS2-1, SS2-2 and SS2-3. Then, the switched-on switchable capacitor element provides the capacitance $C_{sub}$ determined by the capacitors therein.

In addition, the tunable binary-weighted capacitor bank 500 includes the first to fourth binary-weighted capacitor banks CS1 to CB4 and the bank selector 510. The bank selector 510 delivers the lower four bits of D3, D2, D1 and D0 among the six bits D5 to D0 of the digital control signal as the third switching signal SS30. And then, the third switching signal SS30 is applied to one of the four binary-weighted capacitor arrays CB1 to CB4 according to the bank selection signal BSS with four bits of BS1, BS2, BS3 and BS4. Accordingly, at least one switchable capacitor element among four switchable capacitor elements WC1, WC2, WC3, and WC4 is selected by the third switching signal SS30 with four bits of D3 to D0. Then, the selected switchable capacitor element provides the capacitance $C_{wt}$ determined by the capacitors therein.

Hereinafter, a method for compensating the frequency variation according to the digital control signal and the VCO gain ($K_{VCO}$) across the whole tuning range will be described on the basis of voltage controlled oscillator describe above.

In order to maintain the frequency variation according to the digital control signal to be kept linear, in theoretically, the capacitor bank needs to be designed as the following equation:

$$f_c = \frac{1}{2\pi\sqrt{LT \cdot \{C_{var} + (n^{-2} \cdot C_{unit})\}}} \quad (4)$$

where, $C_{var}$ is variable capacitance, n is an integer number, and $C_{unit}$ is a unit capacitance of the subsection capacitor bank 400 and the binary-weighted capacitor bank 500.

In Equation 4, assuming that the varactor capacitance $C_{var}$ is small enough to ignore, the oscillation frequency varies in proportion to n. Accordingly, the amount of frequency variation according to the digital control signal when the tuning voltage is fixed at an arbitrary value can be maintained constant with a predetermined value.

For example, when the digital control code is set to be 6 bits, the number of curves of frequency versus tuning voltage is 64. Therefore, the number of the unit capacitors in the subsection capacitor bank 400 and the binary-weighted capacitor bank 500 are varied to 1, 4, 9, 25, 36, 49, and so on. Then, the oscillation frequency $f_c$ is varied linearly to 1, 2, 3, 4, and so on.

However, because the ratio of the maximum number and the minimum number of the capacitors is too large to realize, it is impossible to realize in practical design using Equation 4.

According to the embodiments of the present invention, as shown in FIGS. 8 and 9A, the whole frequency range is divided into a plurality of frequency ranges, e.g., the four frequency ranges B1, B2, B3 and B4. In addition, the unit capacitances are set to appropriate values such that the amount of frequency variation is constant in each fractionized frequency ranges, also the variable capacitance of varactor bank 300 is set to an appropriate value in each fractionized frequency ranges. As such, it is possible to make the VCO gain $K_{VCO}$ be kept nearly constant within a certain acceptable range. This can be expressed by the following equation:

$$f_{c,n} = \frac{1}{2\pi\sqrt{LT \cdot (C_{var} + C_{bn})}} \quad (5)$$

In Equation 5, in a case where the frequency range of the subsection capacitor bank 400 and the binary-weighted capacitor bank 500 is divided into four sections B1 to B4, assuming that the frequency increases with the digital control signal, the control bits from 48 to 63, the control bits from 32 to 47, the control bits from 16 to 31, and the frequency range from 0 to 15 may be assigned to the first frequency range B1, the second frequency range B2, the third frequency range B3, and the fourth frequency range B4, respectively.

In addition, by designing the subsection capacitor bank 400 and the binary-weighted capacitor bank 500 according to Equation 5, it is possible to make the amount of frequency variation constant according to the digital control signal.

However, because the variable capacitance $C_{var}$ is fixed, the VCO gain $K_{VCO}$ still maybe have severe variation across the whole tuning range. In order to make the VCO gain $K_{VCO}$ variation be kept constant for all fractionized sections B1 to B4, the capacitance of the varactors need to be set appropriately. Accordingly, Equation 5 is modified to the following equation:

$$f_c = \frac{1}{2\pi\sqrt{LT \cdot C_{bn}}} \quad (6)$$

where, $C_{b1} = (1 \cdot C_{var}) + (63-n) \cdot C_{unit}$,
$C_{b2} = (1.5 \cdot C_{var}) + ((NB1 + 1.5 \cdot (47-n)) \cdot C_{unit}$,
$C_{b3} = (2 \cdot C_{var}) + ((NB1 + NB2) + 2 \cdot (31-n)) \cdot C_{unit}$,
$C_{b4} = (3 \cdot C_{var}) + ((NB1 + NB2 + NB3) + 3 \cdot (15-n)) \cdot C_{unit}$.

and $C_{bn}$ has four different values such as $C_{b1}$, $C_{b2}$, $C_{b3}$, and $C_{b4}$ according to each fractionized section, n is an integer, NB1, NB2 and NB3 are set to be 16, 24 and 32 of unit capacitors, respectively.

FIG. 9A is a graph illustrating frequency-tuning voltage characteristic of a voltage controlled oscillator for all digital control signal according to an embodiment of the present invention. In FIG. 9A, the boundaries by first to fourth frequency ranges B1 to B4 are selected by the subsection capacitor bank 400. It is shown that the amount of frequency variation is kept constant in the first to fourth frequency sections B1 to B4 for all digital control signals. That is, FIG. 9A expresses Equation 6 by graphical plot that shows frequency versus varactor control voltage for all the digital control bits.

FIG. 9B is a graph illustrating frequency-digital control signal characteristic of a voltage controlled oscillator when the tuning voltage for variable capacitance is fixed at an arbitrary value according to an embodiment of the present invention. FIG. 9B shows that the frequency can be varied linearly with the control signal.

As shown in FIGS. 9A and 9B, the VCO gain $K_{VCO}$ is kept nearly constant for all the digital control signals, and the oscillation frequency is linearly increased with the digital control signal.

In the voltage controlled oscillator described above, the 3-bit subsection capacitor bank 400 for selecting the frequency ranges B1 to B4 includes 16, 24, or 32 of unit capacitors. As the frequency is lowered, the unit capacitor in the subsection capacitor bank is set as: 0-unit capacitor in the first frequency range B1, 16 unit capacitors in the second frequency range B2, 40-unit (i.e., 16+24) capacitors in the third frequency range B3, and 72-unit (i.e., 16+24+32) capacitors in the fourth frequency range B4.

The capacitance of the varactor bank 300 is varied to 1, 1.5, 2, and 3 times unit varactor capacitance in four frequency sections B1 to B4, respectively, at the same rate as the capacitances of the 4-bit varactor banks for each of the frequency sections. Therefore, the four 4-bit binary-weighted capacitor arrays are designed with unit capacitor ratio of 1, 2, 4 and 8 in the first frequency section B1, 1.5, 3, 6 and 12 in the second frequency section B2, 2, 4, 8 and 16 in the third frequency section B3, and 3, 6, 12 and 24 in the fourth frequency section B4. It is important that the unit capacitance of the four 4-bit binary-weighted capacitor arrays are varied to 1, 1.5, 2, and 3 times so as to allow the ratio of the capacitance of the varactor bank and the total capacitance of the subsection capacitor bank and the binary-weighted capacitor bank to be kept constant.

Table 1 shows an exemplary selection of the capacitor under the following assumptions: the varactor bank 300 includes four switchable variable-capacitance elements VC1 to VC4, the subsection capacitor bank 400 includes three switchable capacitance elements SC1 to SC3, and the binary-weighted capacitor bank 500 includes four binary-weighted capacitor banks CB1 to CB4, as shown in FIGS. 7 and 8; and the upper bits D5 and D4 of the 6-bit digital control signal are encoded to the first switching signal SS10, the second switching signal SS20 and the bank selection signal BSS by the encoder 600, as shown in FIG. 7.

TABLE 1

| Range | | B1 | B2 | B3 | B4 |
|---|---|---|---|---|---|
| Control signal | D5 | 0 | 0 | 1 | 1 |
| | D4 | 0 | 1 | 0 | 1 |
| SS10 | Always on (VC1) | 1 | 1 | 1 | 1 |
| | SS1-1 (VC2) | 0 | 1 | 1 | 1 |
| | SS1-2 (VC3) | 0 | 0 | 1 | 1 |
| | SS1-3 (VC4) | 0 | 0 | 0 | 1 |
| SS20 | SS2-1 (SC1) | 0 | 1 | 1 | 1 |
| | SS2-2 (SC2) | 0 | 0 | 1 | 1 |
| | SS2-3 (SC3) | 0 | 0 | 0 | 1 |
| BSS | B1 (CB1) | 1 | 0 | 0 | 0 |
| | B2 (CB2) | 0 | 1 | 0 | 0 |
| | B3 (CB3) | 0 | 0 | 1 | 0 |
| | B4 (CB4) | 0 | 0 | 0 | 1 |

In Table 1, the elements switched on by the signal are expressed in the parenthesis. The four sections B1 to B4 are the fractionized frequency sections shown in FIG. 9A, which is selected by the respective switching signals.

In addition, as shown in Table 1, one of the first to fourth binary-weighted capacitor arrays CB1 to CB4 is selected by the bank selection signal BSS. Then, as shown in FIG. 7, the bits D3, D2, D1 and D0 of the third switching signal SS30 are delivered to the switchable capacitor element in the selected binary-weighted capacitor array.

As described above, the capacitors in each bank can be switched on according to the digital control bits as shown in Table 1 on the theoretical basis of Equation 6. As such, the capacitance can be varied in a pseudo-exponential way according to the digital control signal.

In addition, FIG. 9A shows a simulation result of the frequency tuning curves with respect to the tuning voltage when the digital control bit is increased from "000000" to "111111". The simulation result in FIG. 9A shows that the VCO gain $K_{VCO}$ is kept nearly constant. For the 1.8V supply voltage, it is general that the tuning voltage is set to be 0.9 V when the capacitor bank of the voltage controlled oscillator is digitally controlled by the digital control bit from the phase locked loop (PLL) system. Accordingly, the amount of frequency variation for all digital control bits is very important when the tuning voltage is 0.9 V.

As described above, the wide-band voltage controlled oscillator according to the embodiments of the present invention can vary the oscillation linearly over a wide bandwidth while having the wide-band frequency tuning characteristics, by allowing the amount of frequency variation for all digital control signals as well as the VCO gain ($K_{VCO}$) with respect to the tuning voltage of the voltage controlled oscillator according to the control signal to be kept constant by using the pseudo-exponentially weighted capacitor bank.

That is, in the wide-band voltage controlled oscillator including the pseudo-exponentially weighted capacitor bank for the linearized coarse tuning characteristics, the gain ($K_{VCO}$) is kept nearly constant and the frequency variation difference between the adjacent bits of the digital control signal is kept constant. As a result, the wide-band voltage controlled oscillator has the characteristic that the oscillation frequency varies linearly according to the digital control bit.

In addition, by increasing the bits of the digital control signal, it is possible to obtain finer linearity characteristics. It is also possible to make locking time be kept constant over the whole frequency tuning range in the PLL system. Consequently, it is possible to avoid the necessity of controlling current of a charge pump for keeping the locking time constant, and thus to reduce complexity in the circuit design.

While the present invention has been shown and described in connection with the exemplary embodiments, it will be apparent to those skilled in the art that modifications and variations can be made without departing from the spirit and scope of the invention as defined by the appended claims.

What is claimed is:

1. A wide-band voltage controlled oscillator comprising:
   a cross-connected oscillator configured to provide an oscillating signal;
   an inductor unit configured to provide inductance for determining a resonance frequency of the oscillating signal;
   a varactor bank comprising a plurality of switchable variable-capacitance elements which are connected to the inductor unit in parallel and have predetermined varactor capacitances, wherein one of the plurality of switchable variable-capacitance elements is selected by a first switching signal so that the varactor bank has a variable capacitance varying with a tuning voltage;
   a subsection capacitor bank comprising a plurality of switchable capacitor elements connected to the inductor unit in parallel, having predetermined capacitances for fractionized frequency sections, and selectively switched on by a second switching signal so that the subsection capacitor bank has a variable capacitance for the fractionized frequency sections; and a binary-weighted capacitor bank comprising a plurality of binary-weighted capacitor banks connected to the inductor unit in parallel and a bank selector configured to select one of the plurality of binary-weighted capacitor banks according to a bank selection signal, wherein each of the binary-weighted capacitor banks comprises a plurality of switchable capacitor elements which are connected in parallel to one another and selectively switched on by a third switching signal so that the binary-weighted capacitor bank has a variable binary-weighted capacitance, wherein the ratio of the variable capacitance of the varactor bank to the total capacitance of the subsection capacitor bank and the binary-weighted capacitor bank is kept constant for a plurality of predetermined frequency sections comprising a first frequency section, a second frequency section, a third frequency section and a fourth frequency section, wherein the total capacitance of the subsection bank and the binary-weighted capacitor bank is further set to vary in a nearly exponential way according to a digital control signal.

2. The wide-band voltage controlled oscillator of claim 1, wherein a variation rate of the varactor capacitance by the varactor capacitor bank is set to be identical to a total variation rate of the total capacitance by the subsection capacitor bank and the binary weighted capacitor bank.

3. The wide-band voltage controlled oscillator of claim 2, wherein the negative transconductance generation unit comprises:

a cross-coupled PMOS transistor pair comprising a pair of PMOS transistors and the source nodes of PMOS transistors are connected to a power supply voltage, wherein a gate and a drain of one PMOS transistor are connected to a drain and a gate of the other PMOS transistor, respectively; and a cross-coupled NMOS transistor pair comprising a pair of NMOS transistors and the source nodes of NMOS transistor are connected to a ground voltage, wherein a gate and a drain of one of the pair of NMOS transistors are connected to a drain and a gate of the other NMOS transistor, respectively.

4. The wide-band voltage controlled oscillator of claim 3, wherein each of the plurality of switchable variable-capacitance elements in the varactor bank comprises:

at least one varactor (or variable capacitor) having capacitance varying with the tuning voltage; and a switch connected between the common-node of varactors which applies the tuning voltage to the varactor according to the first switching signal.

5. The wide-band voltage controlled oscillator of claim 2, wherein each of the plurality of switchable capacitor elements in the subsection capacitor bank comprises:

at least one capacitor; and a switch serially connected to the capacitor and turned on by the second switching signal.

6. The wide-band voltage controlled oscillator of claim 2, wherein each of the plurality of switchable capacitor elements of the binary-weighted capacitor arrays in the tunable binary-weighted capacitor bank comprises:

at least one capacitor; and a switch serially connected to the capacitor and turned on by the third switching signal.

7. The wide-band voltage controlled oscillator of claim 2, further comprising an encoder configured to generate the first switching signal, the second switching signal, the bank selection signal and the third switching signal using a digital control signal.

8. The wide-band voltage controlled oscillator of claim 7, wherein the encoder divides the digital signal into an upper bit to generate the first switching signal, the second switching signal and the bank selection signal and a lower bit to generate the third switching signal.

9. The wide-band voltage controlled oscillator of claim 8, wherein the encoder comprises:

a first encoder configured to generate a first 3-bit switching signal by using upper two bits of a 6-bit digital control signal;

a second encoder configured to generate the second bit switching signal by using the upper two bits; and a third encoder configured to generate a 4-bit bank selection signal by using the upper two bits.

10. The wide-band voltage controlled oscillator of claim 9, wherein the varactor bank comprises the first to the fourth switchable variable-capacitance elements selected by the first 3-bits switching signal.

11. The wide-band voltage controlled oscillator of claim 10, wherein the subsection capacitor bank comprises the first to the third switchable capacitor elements selected by the second 3-bit switching signal.

12. The wide-band voltage controlled oscillator of claim 11, wherein the binary-weighted capacitor bank comprises the first to the fourth binary-weighted capacitor banks, and the bank selector selects one of the binary-weighted capacitor banks according to the 4-bit bank selection signal to deliver lower four bits of the 6-bit digital control signal to the selected binary-weighted capacitor bank.

13. The wide-band voltage controlled oscillator of claim 9, wherein the first encoder generates the first switching signal comprising a first signal, a second signal and a third signal by using the upper two bits.

14. The wide-band voltage controlled oscillator of claim 13, wherein the first encoder comprises:

an OR gate configured to perform logic-OR operation on the upper two bits to generate the first signal of the first switching signal; and an AND gate configured to perform logic-AND operation on the upper two bits to generate the third signal of the first switching signal, and the first encoder delivers an uppermost bit of the upper two bits as the second signal of the first switching signal.

15. The wide-band voltage controlled oscillator of claim 9, wherein the second encoder generates the second switching signal comprising a first signal, a second signal and a third signal using the upper two bits.

16. The wide-band voltage controlled oscillator of claim 15, wherein the second encoder comprises:

an OR gate configured to perform logic-OR operation on the upper two bits to generate the first signal of the second switching signal; and an AND gate configured to perform logic-AND operation on the upper two bits to generate the third signal of the second switching signal, and the second encoder delivers an uppermost bit of the upper two bits as the second signal of the second switching signal.

17. The wide-band voltage controlled oscillator of claim 9, wherein the third encoder comprises:

a first inverter configured to invert an uppermost bit of the 6-bit digital control signal;

a second inverter configured to invert a second uppermost bit of the 6-bit digital control signal;

a first AND gate configured to perform logic-AND operation on output signals of the first and second inverters to generate a first signal;

a second AND gate configured to perform logic-AND operation on the output signal of the first inverter and the second uppermost bit to generate a second signal;

a third AND gate configured to perform logic-AND operation on the uppermost bit of the 6-bit digital control signal and the output signal of the second inverter to generate a third signal; and a fourth AND gate configured to perform logic-AND operation on the uppermost bit of the 6-bit digital control signal and the second uppermost bit to generate a fourth signal.

* * * * *